United States Patent
Morinaga et al.

(10) Patent No.: US 8,632,693 B2
(45) Date of Patent: Jan. 21, 2014

(54) WETTING AGENT FOR SEMICONDUCTORS, AND POLISHING COMPOSITION AND POLISHING METHOD EMPLOYING IT

(75) Inventors: Hitoshi Morinaga, Kiyosu (JP); Shuhei Takahashi, Kiyosu (JP); Shogaku Ide, Kiyosu (JP); Tomohiro Imao, Kiyosu (JP); Naoyuki Ishihara, Kiyosu (JP)

(73) Assignee: Fujimi Incorporated, Kiyosu-shi (JP)

( * ) Notice: Subject to any disclaimer, the term of this patent is extended or adjusted under 35 U.S.C. 154(b) by 553 days.

(21) Appl. No.: 12/496,314

(22) Filed: Jul. 1, 2009

(65) Prior Publication Data
US 2010/0003821 A1    Jan. 7, 2010

(30) Foreign Application Priority Data

Jul. 3, 2008  (JP) ................................ 2008-174683
Apr. 24, 2009 (JP) ................................ 2009-106530

(51) Int. Cl.
*C09K 13/00* (2006.01)
(52) U.S. Cl.
USPC ............................ 252/79.1; 216/89; 438/693
(58) Field of Classification Search
USPC ............ 252/79.1, 79.5; 216/89; 438/692, 693
See application file for complete search history.

(56) References Cited

U.S. PATENT DOCUMENTS

| | | | |
|---|---|---|---|
| 3,715,842 A | 2/1973 | Tredinnick et al. | |
| 4,169,337 A | 10/1979 | Payne | |
| 4,462,188 A | 7/1984 | Payne | |
| 4,588,421 A | 5/1986 | Payne | |
| 5,230,833 A | 7/1993 | Romberger et al. | |
| 5,352,277 A | 10/1994 | Sasaki | |
| 5,916,819 A | 6/1999 | Skrovan et al. | |
| 6,099,604 A | 8/2000 | Sandhu et al. | |
| 6,454,820 B2 | 9/2002 | Hagihara et al. | |
| 6,852,009 B2 | 2/2005 | Kawase et al. | |
| 2001/0003672 A1 | 6/2001 | Inoue et al. | |
| 2003/0154659 A1 | 8/2003 | Xu et al. | |
| 2004/0098924 A1 | 5/2004 | Iwasa | |
| 2004/0127047 A1 | 7/2004 | Yamada et al. | |
| 2005/0054203 A1 | 3/2005 | Yamada | |
| 2005/0081885 A1* | 4/2005 | Zhang et al. ....................... 134/2 |
| 2006/0242912 A1* | 11/2006 | Roh et al. .......................... 51/308 |
| 2007/0256368 A1* | 11/2007 | Takami ............................. 51/308 |

FOREIGN PATENT DOCUMENTS

| | | |
|---|---|---|
| JP | 2005-518668 | 6/2005 |
| JP | 2006-509364 | 3/2006 |
| JP | 2006-352042 | 12/2006 |
| WO | WO 99/32570 | 7/1999 |
| WO | WO 2004/042812 A1 | 5/2004 |

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

To provide a wetting agent for semiconductors and a polishing composition whereby the wettability of a semiconductor substrate surface can be improved, and microdefects such as particle attachments can be remarkably reduced.

A wetting agent for semiconductors, comprising a water soluble polymer compound having a low viscosity and water, and a polishing composition. A 0.3 wt % aqueous solution of the water soluble polymer compound has a viscosity of less than 10 mPa·s at 25° C.

10 Claims, No Drawings

WETTING AGENT FOR SEMICONDUCTORS, AND POLISHING COMPOSITION AND POLISHING METHOD EMPLOYING IT

BACKGROUND OF THE INVENTION

1. Field of the Invention

The present invention relates to a wetting agent for semiconductors, which reduces microdefects and a polishing composition employing it. Further, the present invention relates to a method for polishing semiconductor substrates, metal films and a surface having an insulating layer formed thereon with the polishing composition.

2. Discussion of Background

In recent years, along with the progress in the integration and speed of ULSI, etc. to be used for computers, a design rule of semiconductor devices has been progressively refined. Accordingly, the focal depth in device production processes has become shallow, and requirements for reduction of defects on semiconductor substrates and for smoothness of semiconductor substrates have become strict.

In recent years, as defects to impair device properties, scratches having a depth of a few nm, or dotted- or line-form projections having a height of a few nm, have been concerned. Surface defect inspection devices for detecting such microdefects have been therefore developed. Defects on a wafer surface which was polished with a conventional polishing composition were inspected by an inspection device having ability to detect such microdefects, and as a result, it was found that nano order defects which could not be detected by conventional methods were present on the polished substrate surface.

Even though polishing compounds based on relatively new techniques were used, such surface defects were similarly formed. For example, as a technique to reduce surface defects, Patent Documents 1, 2 and 3 disclose a polishing composition comprising colloidal silica, an alkaline compound and a water soluble polymer compound, for polishing semiconductor substrates. However, according to the study by the present inventors, in a case where polishing is carried out with the polishing composition disclosed in the above Patent Documents, the above-mentioned nano order defects may sometimes be formed, and the cause of such defects is not clearly understood.

Patent Document 1: JP-A-2005-518668
Patent Document 2: JP-A-2006-509364
Patent Document 3: JP-A-2006-352042

SUMMARY OF THE INVENTION

Recently, as refinement of design rules for semiconductor devices has progressed, it is necessary to produce semiconductor devices having no such microdefects. Thus, a polishing composition and a polishing method which can satisfy such requirements are demanded.

That is, the present invention provides the following.

(1) A wetting agent for semiconductors, which comprises water and a water soluble polymer compound, wherein a 0.3 wt % aqueous solution of the water soluble polymer compound has a viscosity of less than 10 mPa·s at 25° C.

(2) A polishing composition, which comprises water, a water soluble polymer compound, colloidal silica and an alkaline compound, wherein a 0.3 wt % aqueous solution of the water soluble polymer compound has a viscosity of less than 10 mPa·s at 25° C.

(3) A method for polishing a semiconductor substrate, which comprises polishing a surface of the semiconductor substrate with the polishing composition as defined in the above (2).

(4) A polishing composition concentrate, which comprises water, a water soluble polymer compound, colloidal silica and an alkaline compound, wherein a 0.3 wt % aqueous solution of the water soluble polymer compound has a viscosity of less than 10 mPa·s at 25° C., and which is to be diluted with a solvent for use, and has a viscosity of from 1.0 to 7.0 mPa·s at 25° C.

(5) A wetting agent concentrate for semiconductors, which comprises water and a water soluble polymer compound and which is to be diluted with a solvent for use, and has a viscosity of from 1.0 to 10.0 mPa·s at 25° C.

By using the wetting agent for semiconductors or the polishing composition of the present invention for treating a semiconductor substrate surface, the wettability on the semiconductor substrate surface can be improved, and microdefects due to e.g. deposition of particles can be remarkably reduced, whereby an excellent polished surface can be obtained.

DETAILED DESCRIPTION OF THE PREFERRED EMBODIMENTS

As the cause of the above-mentioned microdefects, the present inventors have paid attention to insoluble matters contained in a water soluble polymer compound. For example, scratch is formed by pressure concentration attributable to the insoluble matters, and regarding line form projections, it is considered that a degenerated layer attributable to the insoluble matters is formed on the surface, and the degenerated layer becomes a mask, which impairs a regular surface treatment, whereby the line form projections are formed.

Based on the above consideration, it was attempted to remove contaminants by filtrating water soluble polymer compounds, however, it was not effective. It is considered that the water soluble polymer which improves the wettability usually has a high molecular weight and a high viscosity, whereby the aperture of a filter is required to be large at a certain level in order to carry out an effective filtration, and thus fine contaminants could not be removed sufficiently.

On this basis, in order to carry out filtration with a filter having a finner aperture, it was attempted to lower the molecular weight of the water soluble polymer compound. By lowering the molecular weight of the water soluble polymer compound, deterioration of the wettability was worried. However, by the study of the present inventors, it has been found possible to improve the filtration property while maintaining the wettability by adjusting the viscosity of the wetting agent containing the water soluble polymer compound within a specific range, without simply lowering the molecular weight of the water soluble polymer compound. Further, this specific wetting agent was evaluated, whereby it was found that the number of defects was extremely low. Thus, the present invention has been accomplished.

The wetting agent for semiconductors has an effect to improve the hydrophilic property of a substrate surface at the time of a surface treatment such as polishing or rinsing treatment of the semiconductor substrate. For example, at final polishing of silicon, a surface treatment can be particularly preferably carried out with such a wetting agent for semiconductors.

The wetting agent for semiconductors of the present invention comprises a polymer compound having a specific viscosity. In the present invention, the viscosity means a viscosity measured by an Oswald viscometer at 25° C., unless otherwise specified. In the present invention, the polymer compound to be used is required to have a viscosity of its 0.3 wt % aqueous solution of less than 10 mPa·s, preferably less than 8 mPa·s, most preferably less than 6 mPa·s. If the viscosity exceeds the above range, it is difficult to filtrate the aqueous solution containing the polymer compound, namely the wetting agent for semiconductors. Therefore, filtration purification becomes insufficient, and microdefects on a semiconductor substrate surface after surface treatment tend to increase. On the other hand, if the viscosity is extremely low, the effect to improve the hydrophilic property on a surface tends to be insufficient. The polymer compound preferably has a viscosity of its 0.3 wt % aqueous solution of at least 1 mPa·s.

The material of a filter medium for the filtration purification is not particularly restricted, and a polypropylene, a polystyrene, a polyether sulfone, a nylon, a cellulose or glass is usually used. Further, the structure of the filter is not particularly restricted, a conventional filter may be used, and for example, a filter having depth, pleats or membrane structure may be used. Further, the filtration precision of the filter is usually represented by a particle size having a removing efficiency of at least 99%. In the present invention, from the viewpoint of impurity trap accuracy, such filtration precision is preferably at most 1 μm, more preferably at most 0.5 μm, most preferably at most 0.3 μm.

The polymer compound used in the present invention is not particularly restricted, so long as it has the above-mentioned viscosity. However, specifically, the polymer compound is preferably at least one member selected from the group consisting of a hydroxyethyl cellulose, a hydroxypropyl cellulose, a polyvinyl alcohol, a polyvinyl pyrrolidone and a pullulan. Among them, two or more may be used in combination. Further, among them, from the viewpoint of the wettability and the washing property, the hydroxyethyl cellulose is most preferred.

The water soluble polymer compound such as the hydroxyethyl cellulose is not particularly restricted, so long as it has a viscosity within the above-mentioned range. However, the weight average molecular weight as calculated as polyethylene oxide is preferably from 100,000 to 2,000,000, more preferably from 150,000 to 1,500,000, most preferably from 200,000 to 1,000,000. When the weight average molecular weight of the water soluble polymer compound is less than the above-mentioned range, the wettability of a semiconductor substrate surface is insufficient, and fine particles which deposit on the surface tend to increase. On the other hand, if the weight average molecular weight of the water soluble polymer compound exceeds the above-mentioned range, the dispersibility of the polishing composition deteriorates, and gelation may result.

The turbidity of a 1.3 wt % aqueous solution of the water soluble polymer compound used in the present invention is preferably less than 2.0, more preferably less than 1.0, most preferably less than 0.2. If the turbidity exceeds the above range, impurities may exist in the water soluble polymer compound, and micro-line form projections on a polished semiconductor substrate surface tend to increase. Here, the turbidity is measured by the following method. First, 13.0 g of the water soluble polymer compound and 0.5 g of ammonia are added in 986.5 g of ultrapure water, and dissolved by means of a high speed stirrer such as T.K. Robomix (tradename), manufactured by PRIMIX Corporation at 1,400 rpm for 40 minutes. This aqueous solution is left at rest overnight and filtrated with a 10 μm membrane filter. This aqueous solution is further left at rest overnight, and the turbidity is measured by a turbidimeter, for example, WA2000N type turbidity chromaticity meter (tradename), manufactured by NIPPON DENSHOKU INDUSTRIES CO., LTD.

The wetting agent of the present invention comprises water in addition to the water soluble polymer compound. The water is preferably one which contains impurities as little as possible so that respective components of the wetting agent or the polishing composition are not impaired. Specifically, preferred is pure water, ultrapure water or distilled water wherein impurity ions are removed with an ion exchange resin, and then contaminants are removed through a filter. The water is used as a solvent, but another solvent such as an organic solvent may be additionally used.

Further, the wetting agent for semiconductors of the present invention can be prepared as a relatively highly concentrated stock solution for storage or transportation, and at a time of actual polishing operation, the stock solution is diluted with a solvent such as water for use. In a case where the wetting agent is diluted for use, it is, of course, a more concentrated solution, when it is stored or transported. Further, from the viewpoint of handling efficiency, it is preferably produced in such a concentrated form. In general, such a concentrate is diluted by from 5 to 100 times, preferably by from 10 to 50 times for use.

The wetting agent concentrate for semiconductors of the present invention comprises a polymer compound having a specific viscosity, and therefore, it shows a viscosity of at least a certain level. If the viscosity exceeds a certain range, filtration for purification tends to be difficult. If sufficient filtration purification cannot be carried out, deposits on the semiconductor substrate surface after the surface treatment tend to increase. Therefore, the viscosity of the wetting agent concentrate for semiconductors of the present invention is required to be within the range of from 1.0 to 10.0 mPa·s.

The polishing composition of the present invention comprises respective components of (A) a water soluble polymer compound, of which a 0.3 wt % aqueous solution has a viscosity of less than 10 mPa·s at 25° C., (B) colloidal silica, (C) an alkaline compound and (D) water. That is, the polishing composition of the present invention comprises the above-mentioned wetting agent for semiconductors, colloidal silica and an alkaline compound. The polishing composition is suitable for use at the final stage in the polishing process of silicon.

Further, the polishing composition of the present invention can be prepared as a relatively highly concentrated stock solution for storage and transportation, and at the time of actual polishing operation, a solvent such as water is added to the stock solution for dilution, and the diluted solution is used. In a case where the polishing composition is diluted for use, the stock solution is of course a highly concentrated solution under storage or transportation. Further, from the viewpoint of handling efficiency, the polishing composition is preferably produced in such a concentrated form. In general, such a concentrate is diluted by from 5 to 100 times, preferably by from 10 to 50 times for use. Now, the polishing composition concentrate will be explained.

The viscosity of the polishing composition concentrate of the present invention is preferably from 1.0 to 7.0 mPa·s, more preferably from 1.2 to 6.5 mPa·s, most preferably from 1.5 to 6.0 mPa·s. If the viscosity of the polishing composition concentrate is less than above range, when a semiconductor substrate surface is polished with a polishing composition prepared from such a concentrate, particles which deposit on the polished semiconductor substrate surface tend to increase. The reason is considered to be such that a sufficient amount of the water soluble polymer compound for protecting the semiconductor substrate surface after the polishing does not exist. On the other hand, if the viscosity at the time of production exceeds the above range, when filtration purification for removing coarse particles which are the cause of micro-line form projections is carried out, the pore size of the filter cannot be reduced so that the filtration purification is carried out at a substantial rate, and micro-line form projections on the semiconductor substrate surface after the polishing tend to increase.

The material of the filter for the filtration purification is not particularly restricted, and a polypropylene, a polystyrene, a polyether sulfone, a nylon, a cellulose or glass may usually be used. Further, the structure of the filter is not particularly restricted, and conventional filters may be used. For example, a filter having a depth, pleats or membrane structure may be used. Further, the filtration precision of the filter is usually represented by the particle size having a removing efficiency of at least 99%. In the present invention, from the viewpoint of trapping contaminants, such filtration precision is preferably at most 1 μm, more preferably at most 0.5 μm, most preferably at most 0.3 μm.

The content of particles having a particle size of larger than a certain level in the polishing composition concentrate of the present invention is preferably low. Specifically, the number of particles having a particle size of at least 0.6 μm (hereinafter, referred to as LPC) contained in the polishing composition concentrate is preferably at most 15,000 particles/mL, more preferably at most 10,000 particles/mL, most preferably at most 7,500 particles/mL. If LPC exceeds the above range, contaminants in the polishing composition concentrate exceed a permissible amount, and small particles (LPD) on the semiconductor substrate surface after the polishing tend to increase. Here, LPC can be measured by, for example, Particle Sizing System, AccuSizer Model 780, manufactured by Showa Denko K.K.

Although the cause for the formation of particles having a particle size of at least 0.6 μm measured here is not clear, the main cause is considered to be the water soluble polymer compound.

Further, it is known that LPC is variable depending on the production process of the water soluble polymer compound or the purification method. Therefore, in a case where it is desired to change the lot of the water soluble polymer compound, it is preferred to measure LPC of the composition or the concentrate for quality control.

Further, in a case where the polishing composition concentrate is diluted when used, LPC varied depending on the dilution times. As water used for dilution, one having a high purity is usually used, and therefore, contamination from water is little. When the polishing concentrate is diluted by n times, LPC usually becomes about 1/n. In a case where the polishing composition concentrate is left at rest for a long time after the dilution, LPC may sometimes increase. However, in a case where the concentrate is diluted for use, usually it is used immediately after the dilution. Therefore such increase of LPC is rarely problematic.

The content of colloidal silica in the polishing composition concentrate of the present invention is preferably from 0.1 to 50 wt %, more preferably from 1 to 25 wt %, most preferably from 3 to 15 wt %. If the content of colloidal silica is less than the above range, the polishing rate tends to be insufficient. On the other hand, if the content of colloidal silica exceeds the above range, the haze tends to deteriorate.

The particle size of the colloidal silica used in the present invention is preferably from 5 to 200 nm, more preferably from 5 to 150 nm, most preferably from 5 to 120 nm, as the average particle size obtained from the specific surface area measured by a specific surface area measuring method (BET method) of powder by air adsorption. Further, as the average particle size calculated from laser scattering, it is preferably from 5 to 300 nm, more preferably 5 to 200 nm, most preferably from 5 to 150 nm. If the average particle size of the colloidal silica is less than the above range, the polishing rate tends to be insufficient. On the other hand, if the average particle size of the colloidal silica exceeds the above range, the surface roughness of the semiconductor substrate becomes large, and the haze level thereby tends to deteriorate.

Further, the polishing composition of the present invention comprises an alkaline compound. As such an alkaline compound, optional one may be used so long as it is water soluble and basic. However, as mentioned after, metals should be avoided, since the metals may pollute semiconductor substrates to be polished. Accordingly, the alkaline compound is preferably a basic organic compound. Specifically, ammonia or a quaternary ammonium base such as tetramethylammonium hydroxide, tetraethylammonium hydroxide or tetrabutylammonium hydroxide may be mentioned. Ammonia is most preferred.

The content of the water soluble polymer compound contained in the polishing composition concentrate of the present invention is preferably from 0.01 to 3 wt %, more preferably from 0.05 to 2 wt %, most preferably from 0.1 to 1 wt %. If the content of the water soluble polymer compound is less than the above range, the effects to improve the haze level and the wettability of the polished semiconductor substrate surface are likely to be insufficient. On the other hand, if the content of the water soluble polymer compound exceeds the above range, the viscosity of the polishing composition becomes too high, and it is difficult to remove fine impurities by filtration, or LPC tends to increase.

Further, it is preferred that in the polishing composition concentrate of the present invention, metals which are contained as impurities are little. For example, the content of sodium (Na) contained in the polishing composition concentrate of the present invention is preferably less than 20 ppm, more preferably less than 5 ppm, most preferably less than 1 ppm. If the content of Na exceeds the above range, particles which remain on the semiconductor substrate surface after the polishing tend to increase.

Further, the total content of transition metals such as iron (Fe), nickel (Ni), copper (Cu), chromium (Cr) and zinc (Zn) contained in the polishing composition concentrate of the present invention is preferably less than 1 ppm, more preferably less than 0.3 ppm, most preferably less than 0.1 ppm. If the content of transition metals exceeds the above range, the semiconductor substrate may be polluted with transition metals.

The polishing composition or the concentrate of the present invention may further contain a chelating agent such as diethylenetriamine pentaacetic acid, triethyltetraamine hexaacetic acid or N,N,N',N'-ethylenediamine tetrakis(methylenephosphonic acid) as an additive component. The chelating agent has an effect to reduce metal pollution. Further, a nonionic surfactant such as polyoxyethylene sorbitane fatty acid ester, polyoxyethylene alkyl ether, polyoxyethylene oxide or polyoxypropylene copolymer, anionic surfactant or the like may be contained. These surfactants have effects to reduce the haze and abrasive grain residue, etc.

The method of the present invention for polishing a semiconductor substrate comprises polishing a semiconductor substrate surface with the above-mentioned polishing composition or a diluted polishing composition concentrate. Since the polishing composition of the present invention is suitable for obtaining a precisely polished surface with little deposit on the surface, it is preferably used for final polishing or in the final polishing step. When the semiconductor substrate surface is polished with the polishing composition of the embodiment of the present invention in the final polishing step, it is common that while supplying the polishing composition to the semiconductor substrate surface, a polishing pad is rotated as pressed on the semiconductor substrate surface. Here, the polishing composition is used for polishing the semiconductor substrate surface by mechanical polishing with the colloidal silica and chemical polishing with the alkaline compound, so-called chemical mechanical polishing (CMP). By such composite polishing, the polishing rate of semiconductor substrates can be improved. Further, the haze level can be improved with the wetting agent in the polishing composition, while the wettability of the polished semiconductor substrate surface is improved, and deposition of particles can be removed.

In the present invention, the wetting agent can be used as a rinse agent for a polishing treatment as it is or by adding a solvent. Such a rinse agent can be used for washing a substrate surface before or after the polishing treatment or between plural times polishing treatments.

In the foregoing, the application of the wetting agent of the present invention to the polishing composition has been described in detail, and the wetting agent for semiconductors of the present invention may also be used for treatments other than the polishing. For example, the wetting agent for semiconductors of the present invention may be used as a rinse agent which is poured on the semiconductor substrate for washing off the polishing composition from the washed semiconductor substrate or as a wetting agent to impart wettability for storing the polished semiconductor substrate. When the wetting agent is used for such applications, as a case requires, a solvent such as water or an organic solvent, various chelating agents, a surfactant or the above-mentioned alkaline compound may be added. In each treatment, the concentration of the water soluble polymer compound contained in the wetting agent for semiconductors or the rinse agent is preferably from 0.005 wt % to 0.1 wt %.

EXAMPLES 1 to 3 and COMPARATIVE EXAMPLE 1

Method for Preparing Rinse Agent

A water soluble polymer compound as shown in Table 1 was mixed with deionized water, followed by filtration to remove gel state suspended matters to prepare a rinse agent. The content of the water soluble polymer compound in the rinse agent was controlled to be 0.25 wt %. The content of sodium in the rinse agent was less than 5 ppm, and the total content of iron, nickel, copper, chromium and zinc was less than 0.1 ppm.

Rinse Method

The obtained rinse agent was diluted by 20 times by volume by adding deionized water. A silicon wafer was polished with a commercially available polishing agent (GLANZOX-1103 (tradename), manufactured by FUJIMI INCORPORATED) under the following conditions.

Polishing machine: single wafer polishing machine PNX-332B (tradename), manufactured by Okamoto Machine Tool Works, Ltd.

Polishing load: 15 kPa

Polishing platen rotational speed: 30 rpm

Head rotational speed: 30 rpm

Polishing time: 4 min.

Temperature of polishing composition: 20° C.

Feeding rate of polishing composition: 500 mL/min. (the polishing composition was flowed away after use).

Then, the silicon wafer was subjected to final-polishing with a commercially available final polishing agent (GLANZOX-3105 (tradename), manufactured by FUJIMI INCORPORATED) under the same conditions. The silicon wafer had the diameter of 300 mm, the conductive type of p type, the crystal orientation of <100> and the resistivity of at least 0.1 $\Omega \cdot$ cm and less than 100 $\Omega \cdot$ cm.

After completion of the polishing, the diluted rinse agent was continuously poured on the substrate for 20 seconds.

The number of line form projections and the number of small particles (LPD) on the semiconductor substrate surface after completion of the polishing and the rinse treatment were evaluated. Table 1 shows results.

The number of line form projections was measured by examining the number of line form projections having a length of at least 1 μm on the polished silicon wafer by a wafer tester (MAGICS M5350 (tradename), manufactured by Lasertec Corporation. In Table, "excellent" means that the number of line form projections on the polished silicon wafer having a diameter of 300 mm was less than 10, "good" means that it was at least 10 and less than 20, "not bad" means that it was at least 20 and less than 50, and "bad" means that it was at least 50.

Further, the number of small particles (LPD) was evaluated by the number of particles having a size of at least 0.037 μm which were present on the polished silicon wafer and measured by using a wafer tester (Surfscan SP2 (tradename), manufactured by KLA-Tencor Corporation). In Table, "excellent" means that the number of particles per one sheet of 300 mm wafer was at least 70 and less than 100, "good" means that it was at least 100 and less than 200, "not bad" means that it was at least 200 and less than 300, and "bad" means that it was at least 300.

TABLE 1

|  | Type of compound | Weight average molecular weight | 0.3 wt % aqueous solution viscosity (mPa · s) | 1.3 wt % aqueous solution turbidity | Number of line form projections | LPD |
|---|---|---|---|---|---|---|
| Ex. 1 | Hydroxyethyl cellulose | 300,000 | 3.1 | 0.67 | Good | Good |
| Ex. 2 | Hydroxyethyl cellulose | 250,000 | 2.4 | 0.06 | Excellent | Excellent |
| Ex. 3 | Hydroxyethyl cellulose | 1,400,000 | 9.5 | 0.15 | Excellent | Good |

TABLE 1-continued

| | Type of compound | Weight average molecular weight | 0.3 wt % aqueous solution viscosity (mPa·s) | 1.3 wt % aqueous solution turbidity | Number of line form projections | LPD |
|---|---|---|---|---|---|---|
| Comp. Ex. 1 | Hydroxyethyl cellulose | 1,600,000 | 11.5 | 0.55 | Bad | Not bad |

The weight average molecular weight was measured by a gel permeation chromatography method under the following conditions.
Column: TSK gel GMPWxl × 2 + G2500PWxl (φ 7.8 mm × 300 mm × 3)
Column temperature: 40° C.
Eluent: 200 mM sodium nitrate aqueous solution
Sample concentration: 0.05%
Flow rate: 1.0 mL/min
Injection amount: 200 μL
Detector: RI (differential refractometer)

EXAMPLES 4 to 20 and COMPARATIVE EXAMPLES 2 and 3

Method for Preparing Polishing Composition

Colloidal silica, ammonia and a wetting agent for semiconductors were mixed with deionized water as shown in Table 2, followed by removal of gelled suspended matters to prepare a polishing composition concentrate. The content of colloidal silica in the polishing composition was made to be 9.2 wt %, and the content of ammonia in the polishing composition was made to be 0.2 wt %. The total content of iron, nickel, copper, chromium and zinc in the polishing composition was at most 0.1 ppm. Further, the average particle size of the colloidal silica was 35 nm as the primary particle size measured by FlowSorb II 2300 (manufactured by Micromeritics Instrument Corporation), and 70 nm as the secondary particle size measured by N4 Plus Submicron Particle Sizer (manufactured by Beckman Coulter, Inc.). The viscosity of the polishing composition before dilution measured by an Oswald viscometer is shown in Table 2. The polishing composition was filtration-purified by a filter having the finest aperture which can filtrate the composition.

Polishing Method

The obtained polishing composition concentrate was diluted by 20 times by volume by adding deionized water, and the silicon wafer was subjected to final polishing under the same condition as in Example 1. Prior to the final polishing, the silicon wafer was preliminarily polished with a commercially available polishing agent (GLANZOX-1103 (tradename), manufactured by FUJIMI INCORPORATED). The silicon wafer had the diameter of 300 mm, the conductive type of P type, the crystal orientation of <100> and the resistivity of at least 0.1 Ω· cm and less than 100 Ω· cm.

The number of line form projections, the number of small particles (LPD) and the haze on the polished semiconductor substrate surface after the polishing were evaluated. The obtained results were as shown in Table 2.

The number of line form projections was measured by examining the number of line form projections having a length of at least 1 μm on the polished silicon wafer by a wafer tester (MAGICS M5350 (tradename), manufactured by Lasertec Corporation. In Table, "excellent" means that the number of line form projections on the polished silicon wafer having a diameter of 300 mm was less than 10, "good" means that it was at least 10 and less than 20, "not bad" means that it was at least 20 and less than 50, and "bad" means that it was at least 50.

Further, the number of fine particles (LPD) was evaluated by the number of particles having a size of at least 0.037 μm which were present on the polished silicon wafer and measured by using a wafer tester (Surfscan SP2 (tradename), manufactured by KLA-Tencor Corporation). In Table, "excellent" means that the number of particles per 300 mm wafer was at least 70 and less than 100, "good" means that it was at least 100 and less than 200, "not bad" means that it was at least 200 and less than 300, and "bad" means that it was at least 300.

Further, the haze was evaluated based on the value measured by Surfscan SP2 (tradename), manufactured by KLA-Tencor Corporation. In Table, "excellent" means that the measured value was less than 0.10 ppm, "good" means that the measured value was at least 0.10 ppm and less than 0.20 ppm, and "bad" means that the measured value was at least 0.20 ppm.

TABLE 2

| | Water soluble polymer compound | | | | Polishing composition | | | | |
|---|---|---|---|---|---|---|---|---|---|
| | Type of compound | Weight average molecular weight | 0.3 wt % aqueous solution viscosity (mPa·s) | 1.3 wt % aqueous solution turbidity | Content of the polymer compound | Viscosity (mPa·s) | Number of projections | LPD | Haze |
| Ex. 4 | Hydroxyethyl cellulose | 300,000 | 3.1 | 0.67 | 0.30 | 3.2 | Good | Good | Excellent |
| Ex. 5 | Hydroxyethyl cellulose | 1,000,000 | 8.1 | 0.50 | 0.20 | 4.6 | Good | Good | Excellent |
| Ex. 6 | Hydroxyethyl cellulose | 1,400,000 | 9.7 | 0.57 | 0.10 | 4.4 | Good | Not bad | Excellent |
| Ex. 7 | Hydroxyethyl cellulose | 120,000 | 1.5 | 0.09 | 0.60 | 2.7 | Excellent | Good | Good |
| Ex. 8 | Hydroxyethyl cellulose | 160,000 | 1.8 | 0.08 | 0.40 | 3.0 | Excellent | Excellent | Good |
| Ex. 9 | Hydroxyethyl cellulose | 250,000 | 2.4 | 0.06 | 0.04 | 1.1 | Good | Not bad | Excellent |
| Ex. 10 | | | | | 0.06 | 1.3 | Excellent | Not bad | Excellent |
| Ex. 11 | | | | | 0.31 | 3.3 | Excellent | Excellent | Excellent |

TABLE 2-continued

| | | Water soluble polymer compound | | Polishing composition | | | | |
|---|---|---|---|---|---|---|---|---|
| | Type of compound | Weight average molecular weight | 0.3 wt % aqueous solution viscosity (mPa·s) | 1.3 wt % aqueous solution turbidity | Content of the polymer compound | Viscosity (mPa·s) | Number of projections | LPD | Haze |
| Ex. 12 | | | | | 0.80 | 6.2 | Excellent | Good | Excellent |
| Ex. 13 | | | | | 1.00 | 6.8 | Good | Good | Good |
| Ex. 14 | | | | | 1.20 | 9.0 | Not bad | Not bad | Good |
| Ex. 15 | Hydroxyethyl cellulose | 700,000 | 6.8 | 0.14 | 0.22 | 4.6 | Good | Excellent | Excellent |
| Ex. 16 | Hydroxyethyl cellulose | 1,400,000 | 9.5 | 0.15 | 0.10 | 4.4 | Not bad | Good | Excellent |
| Ex. 17 | Hydroxypropyl cellulose | 150,000 | 1.7 | 0.32 | 0.30 | 1.8 | Good | Good | Good |
| Ex. 18 | Polyvinyl alcohol | 22,000 | 2.0 | 0.40 | 0.30 | 2.0 | Good | Good | Good |
| Ex. 19 | Polyvinyl pyrrolidone | 15,000 | 1.1 | 0.25 | 0.30 | 1.1 | Good | Excellent | Good |
| Ex. 20 | Pullulan | 200,000 | 1.1 | 0.31 | 0.30 | 1.2 | Good | Good | Good |
| Comp. Ex. 2 | Hydroxyethyl cellulose | 1,600,000 | 11.7 | 0.16 | 0.10 | 5.8 | Not bad | Bad | Good |
| Comp. Ex. 3 | Hydroxyethyl cellulose | 1,600,000 | 11.5 | 0.55 | 0.10 | 5.8 | Bad | Bad | Good |

The weight average molecular weight was measured in the same manner as in Example 1.

EXAMPLES 21 to 24

The measurements were carried out in the same manner as in Examples 5 and 11, except that the hydroxyethyl cellulose was changed. Here, although the molecular weight of the hydroxyethyl celluloses in Examples 21 and 22 was the same as that in Example 5, the hydroxyethyl celluloses used in Examples 21 and 22 were produced by a production method or purification method different from Example 5. Similarly, the molecular weight of the hydroxyethyl celluloses in Examples 23 and 24 was the same as that in Example 11, however, the hydroxyethyl celluloses used in Examples 23 and 24 were produced by a production method or purification method different from Example 11.

Method for Preparing Polishing Composition

Colloidal silica, ammonia and a wetting agent for semiconductors were mixed with deionized water as shown in Table 3, followed by filtration to remove gel state suspended matters to prepare a polishing composition concentrate. The content of colloidal silica in the polishing composition was made to be 9.2 wt %, and the content of ammonia in the polishing composition was made to be 0.2 wt %. The total content of iron, nickel, copper, chromium and zinc in the polishing composition was at most 0.1 ppm. Further, the average particle size of the colloidal silica was 35 nm as the primary particle size measured by FlowSorb II 2300 (manufactured by Micromeritics Instrument Corporation), and 70 nm as the secondary particle size measured by N4 Plus Submicron Particle Sizer (manufactured by Beckman Coulter, Inc.). The viscosity of the polishing compositions before dilution measured by an Oswald viscometer is shown in Table 3. The polishing composition was filtration-purified by a filter having the finest aperture which can filtrate the composition.

Polishing Method

The obtained polishing composition concentrate was diluted by 20 times by volume by adding deionized water, and the silicon wafer was subjected to final polishing under the same condition as in Example 1. Prior to the final polishing, the silicon wafer was preliminarily polished with a commercially available polishing agent (GLANZOX-1103 (tradename), manufactured by FUJIMI INCORPORATED). The silicon wafer had the diameter of 300 mm, the conductive type of P type, the crystal orientation of <100> and the resistivity of at least 0.1 Ω·cm and less than 100 Ω·cm.

The number of line form projection defects of the polished semiconductor substrate surface, the number of small particles (LPD) and the haze were evaluated. The obtained results are shown in Table 3.

The number of line form projections was measured by examining the number of line form projection defects having a length of at least 1 μm on the polished silicon wafer by a wafer tester (MAGICS M5350 (tradename), manufactured by Lasertec Corporation. In Table, "excellent" means that the number of line form projections on the polished silicon wafer having a diameter of 300 mm was less than 10, "good" means that it was at least 10 and less than 20, "not bad" means that it was at least 20 and less than 50, and "bad" means that it was at least 50.

Further, the number of fine particles (LPD) was evaluated by the number of particles having a size of at least 0.037 μm which were present on the polished silicon wafer and measured by using a wafer tester (Surfscan SP2 (tradename), manufactured by KLA-Tencor Corporation). In Table, "very excellent" means that the number of particles per 300 mm wafer was less than 70, "excellent" means that it was at least 70 and less than 100, "good" means that it was at least 100 and less than 200, "not bad" means that it was at least 200 and less than 300, and "bad" means that it was at least 300.

Further, the haze was evaluated based on the value measured by Surfscan SP2 (tradename), manufactured by KLA-Tencor Corporation. In Table, "excellent" means that a measured value was less than 0.10 ppm, "good" means that a measured value was at least 0.10 ppm and less than 0.20 ppm, and "bad" means that a measured value was at least 0.20 ppm.

TABLE 3

| | | Water soluble polymer compound | | | Polishing composition | | | | | |
|---|---|---|---|---|---|---|---|---|---|---|
| | Type of compound | Weight average molecular weight | 0.3 wt % aqueous solution viscosity (mPa·s) | 1.3 wt % aqueous solution turbidity | Content of the polymer compound | Viscosity (mPa·s) | LPC (number/ml) | Number of line form projections | LPD | Haze |
| Ex. 21 | Hydroxyethyl cellulose | 1,000,000 | 8.1 | 0.50 | 0.20 | 4.6 | 10,000 | Good | Excellent | Excellent |
| Ex. 5 | | | | | | | 15,000 | Good | Good | Excellent |
| Ex. 22 | | | | | | | 18,000 | Good | Not bad | Excellent |
| Ex. 23 | Hydroxyethyl cellulose | 250,000 | 2.4 | 0.06 | 0.31 | 3.3 | 7,000 | Excellent | Very excellent | Excellent |
| Ex. 11 | | | | | | | 10,000 | Excellent | Excellent | Excellent |
| Ex. 24 | | | | | | | 15,000 | Excellent | Good | Excellent |

The weight average molecular weight was measured in the same manner as in Example 1.

As is evident form Tables 1 to 3, the results of Examples 1 to 24 were satisfactory in that excellent, good or not bad was obtained in the respective evaluations. Further, as is evident from Table 3, even in a case where the hydroxyethyl cellulose was used, the smaller the measured value of LPC, the better the result. On the other hand, in Comparative Examples 1 o 3, at least one of the evaluated properties was poor, and practically satisfactory result was not obtained.

The entire disclosure of Japanese Patent Application No. 2005-336705 filed on Nov. 22, 2005 including specification, claims and summary is incorporated herein by reference in its entirety.

What is claimed is:

1. A wetting agent for semiconductors, which comprises water and a water soluble polymer compound, wherein
a 0.3 wt % aqueous solution of the water soluble polymer compound has a viscosity of less than 10 mPa·s at 25° C., and wherein a 1.3 wt % aqueous solution of the water soluble polymer compound has a turbidity of less than 2.0.

2. The wetting agent for semiconductors according to claim 1, wherein the water soluble polymer compound is a hydroxy ethyl cellulose having an average molecular weight of from 100,000 to 2,000,000 as calculated as the polyethylene oxide.

3. A method for wetting a semiconductor substrate, which comprises wetting a surface of the semiconductor substrate with the wetting agent of claim 1.

4. The wetting agent for semiconductors according to claim 1, wherein the water soluble polymer compound is at least one member selected from the group consisting of a hydroxy ethyl cellulose, a hydroxy propyl cellulose, a polyvinyl alcohol, a polyvinyl pyrrolidone and pullulan.

5. The wetting agent for semiconductors according to claim 1, wherein the amount of water soluble polymer compound is from 0.005 to 0.1 wt %.

6. A polishing composition concentrate, which comprises water, a water soluble polymer compound in an amount of from at least 0.06 wt % to at most 0.80 wt %, colloidal silica and an alkaline compound, wherein a 0.3 wt % aqueous solution of the water soluble polymer compound has a viscosity of less than 10 mPa·s at 25° C., and wherein a 1.3 wt % aqueous solution of the water soluble polymer compound has a turbidity of less than 2.0.

7. The polishing composition concentrate according to claim 6, wherein a 0.3 wt % aqueous solution of the water soluble polymer has a viscosity of from 1.0 to 7.0 mPa·s at 25° C.

8. A polishing composition comprising water and a water soluble polymer compound wherein
0.3 wt % aqueous solution of the water soluble polymer compound has a viscosity of less than 10 mPa·s at 25° C.,
and wherein 1.3 wt % aqueous solution of the water soluble polymer compound has a turbidity of less than 2.0.

9. A method for polishing a semiconductor substrate, which comprises polishing a surface of the semiconductor substrate with the polishing composition of claim 8.

10. A wetting agent concentrate for semiconductors, which comprises water and a water soluble polymer compound wherein a 0.3 wt % aqueous solution of the water soluble polymer compound has a viscosity of from 1.0 to 10.0 mPa·s at 25° and wherein a 1.3 wt % aqueous solution of the water soluble polymer compound has a turbidity of less than 2.0.

* * * * *